US008823389B2

(12) United States Patent
Takahashi et al.

(10) Patent No.: US 8,823,389 B2
(45) Date of Patent: Sep. 2, 2014

(54) METHOD FOR IDENTIFYING EMI SOURCES IN AN ELECTRICAL SYSTEM

(75) Inventors: Masayoshi Takahashi, West Bloomfield, MI (US); Hua Zeng, Novi, MI (US)

(73) Assignee: Hitachi, Ltd., Tokyo (JP)

( * ) Notice: Subject to any disclaimer, the term of this patent is extended or adjusted under 35 U.S.C. 154(b) by 192 days.

(21) Appl. No.: 13/597,602

(22) Filed: Aug. 29, 2012

(65) Prior Publication Data

US 2014/0062502 A1  Mar. 6, 2014

(51) Int. Cl.
*G01R 29/26* (2006.01)

(52) U.S. Cl.
USPC ...... 324/613; 324/628; 324/750.12; 324/144; 342/13; 342/14; 342/18; 726/34; 455/226.4

(58) Field of Classification Search
USPC ......... 324/628, 613, 750.12, 144; 342/13, 14, 342/18; 726/34
See application file for complete search history.

(56) References Cited

U.S. PATENT DOCUMENTS

| | | | | |
|---|---|---|---|---|
| 4,731,586 A | * | 3/1988 | Perkins | 324/536 |
| 5,017,921 A | * | 5/1991 | McGill et al. | 342/18 |
| 5,712,641 A | * | 1/1998 | Casabona et al. | 342/362 |
| 6,639,541 B1 | * | 10/2003 | Quintana et al. | 342/18 |
| 7,002,359 B2 | * | 2/2006 | Kahng et al. | 324/627 |
| 7,613,576 B2 | * | 11/2009 | Gross et al. | 702/57 |
| 8,032,330 B2 | * | 10/2011 | Makela et al. | 702/185 |
| 8,069,490 B2 | * | 11/2011 | Gross et al. | 726/34 |
| 8,259,879 B2 | * | 9/2012 | Berens et al. | 375/346 |
| 8,341,759 B2 | * | 12/2012 | Gross et al. | 726/34 |
| 8,654,001 B2 | * | 2/2014 | Tauber et al. | 342/13 |
| 2007/0038402 A1 | * | 2/2007 | Zhang | 702/117 |

* cited by examiner

*Primary Examiner* — Tung X Nguyen
*Assistant Examiner* — Thang Le
(74) *Attorney, Agent, or Firm* — Gifford, Krass, Sprinkle, Anderson & Citkowski, P.C.

(57) ABSTRACT

A method for identifying EMI sources in a system having a plurality of electrical components connected together by cables wherein each set of two electrical components connected by a cable forms a potential EMI source. A plurality of antennas are positioned around the vehicle and the EMI from each antenna is measured over a plurality of frequencies and the frequencies having an EMI greater than a predetermined threshold and a measurement profile of the received EMI versus the antennas for each of the identified frequencies is created. EMI reception is then simulated for each potential EMI source and a simulation profile of the received EMI versus the antennas is plotted for each potential EMI source. The actual source of the EMI is then identified by comparing the measurement profile with the simulation profile for the potential EMI sources at each frequency to determine a match of the profiles.

6 Claims, 3 Drawing Sheets

METHOD FOR IDENTIFYING EMI SOURCES IN AN ELECTRICAL SYSTEM

BACKGROUND OF THE INVENTION

I. Field of the Invention

The present invention relates to a method for identifying electromagnetic interference (EMI) in an electrical system, such as vehicles including automotive, train, construction machine, etc.

II. Description of Related Art

The number of electrical components in electrical systems such as automotive vehicles has increased dramatically in recent years. As a result, electromagnetic capability (EMC) has become not only increasingly important, but more challenging than previously. The achievement of EMC, furthermore, is important not only to protect the electrical components of the vehicle from malfunction or reduced efficiency, but also to protect the infotainment systems of the vehicle from electrical noise and other types of electrical interference.

In an automotive vehicle, the automotive vehicle includes a plurality of electrical components which are connected together by a series of cables which extend throughout the vehicle. Both these cables as well as the electrical components themselves possibly form an antenna for EMI. When this happens, the two components coupled together by a cable form a possible source of EMI. Such EMI may form not only at different frequencies, but in different magnitudes. However, EMI above a predetermined threshold at any one or more frequencies is oftentimes unacceptable to the manufacturer of the automotive vehicle.

While the identification of unacceptable EMI at one or more frequencies is easy to detect, the identification of the potential EMI source creating the EMI poses a much more difficult problem. Indeed, the identification of the component or components causing the unacceptable EMI may prove so elusive that it causes delay of the vehicle production.

SUMMARY OF THE PRESENT INVENTION

The present invention provides a method for identifying EMI sources in an electrical system, such as an automotive vehicle, a train vehicle, etc. which overcomes the above-mentioned disadvantages.

In brief, all complex electrical systems include a plurality of electrical components connected together by a plurality of cables. Each set of two electrical components connected together by one cable forms a potential EMI source.

A plurality of antennas are positioned at spaced locations around or in the vehicle at known and fixed locations. Each antenna, furthermore, is connected to a receiver capable of reception over a wide frequency range.

The EMI from each of the antennas is then measured over the frequency range. Thereafter, the frequencies exhibiting a measured EMI greater than a predetermined threshold or limit are identified.

A measurement profile or graph of the received EMI versus the antennas is then created for each of the identified frequencies exhibiting excessive EMI. This profile, which is in the nature of a chart, plots the magnitude of the EMI on the vertical axis and the different antennas on the horizontal axis. A different measurement profile is created for each frequency exhibiting excessive EMI.

The EMI reception by each antenna is then simulated at each frequency exhibiting excessive EMI for each potential EMI source in the vehicle. The vehicle configuration on the simulation can be defined using CAD data and architecture information and electric properties of the components.

Thereafter, utilizing the data created during the simulation, a simulation profile of received EMI versus the antennas is then created for each potential EMI source. Thus, with the magnitude of the simulated received EMI on the vertical axis and the antenna on the horizontal axis, a simulation profile of received EMI versus the antennas is formed for each potential EMI source at each of the frequencies exhibiting excessive EMI.

In order to identify the noise source of the EMI from the multiple potential EMI sources, at each frequency exhibiting excessive EMI the profile of the measurement is compared with the simulation profile for each potential EMI source. When the profile for a potential EMI source "matches", or nearly matches, the measurement profile for the EMI at that frequency, the potential EMI source is then identified as the noise source. The number of the noise sources may be more than one if the measurement profile matches multiple potential EMI source profiles. Appropriate procedures may then be taken by the designer to eliminate or at least reduce the EMI emissions caused by the identified noise sources.

By creating a measurement profile of the received EMI for each of the identified frequencies having excessive EMI and comparing them to the simulated EMI reception for each potential source, rapid diagnosis of the EMI sources in the vehicle, or other electrical system, is simplified.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which.

DETAILED DESCRIPTION OF A PREFERRED EMBODIMENT OF THE PRESENT INVENTION

Figure 1:
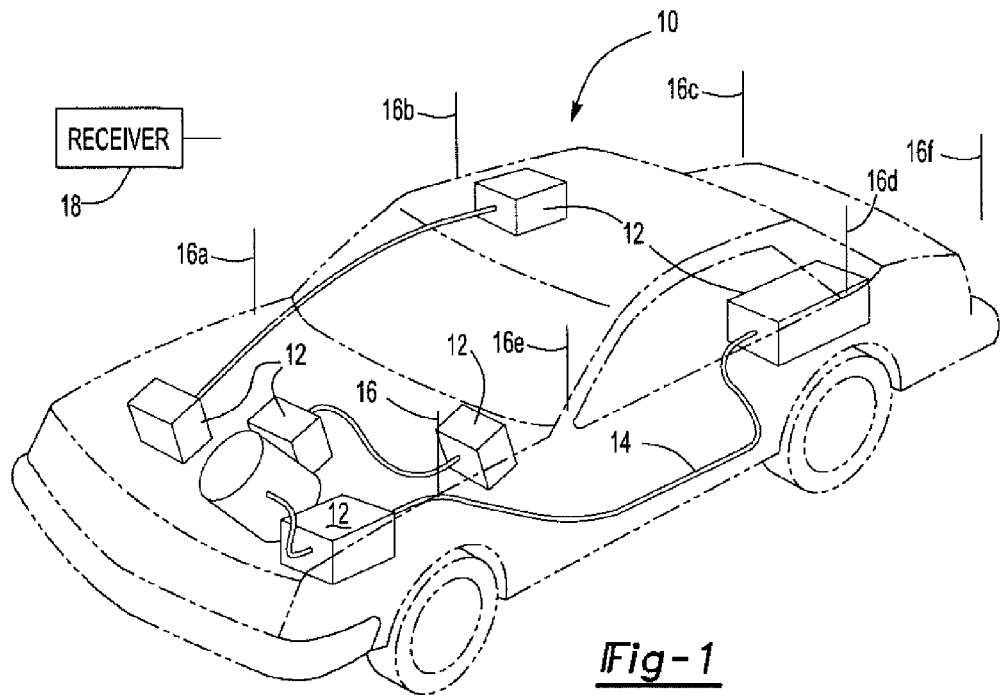
FIG. 1 is a diagrammatic view illustrating the testing setup in an automotive vehicle.

With reference first to FIG. 1, an electrical system 10, such as an automotive vehicle, is illustrated. The electrical system 10 includes a plurality of electrical components 12 which are interconnected together by one or more wires or cables 14. For example, in automotive vehicles, a plurality of wiring harnesses extending through the vehicle are employed to interconnect the various electrical components 12 together. These electrical components 12, furthermore, may be as simple as a light bulb or as complex as an engine control unit. Some common-mode currents unintentionally and undesirably occur on the wire cable connecting among the components 12. These common-mode currents may become the cause of the EMI noise.

A plurality of electromagnetic antennas 16a-16f are positioned around or in the automotive vehicle. These antennas 16a-16f are designed to receive electromagnetic radiation over a bandwidth of frequencies, e.g. 100 kHz to several GHz.

Figure 2:
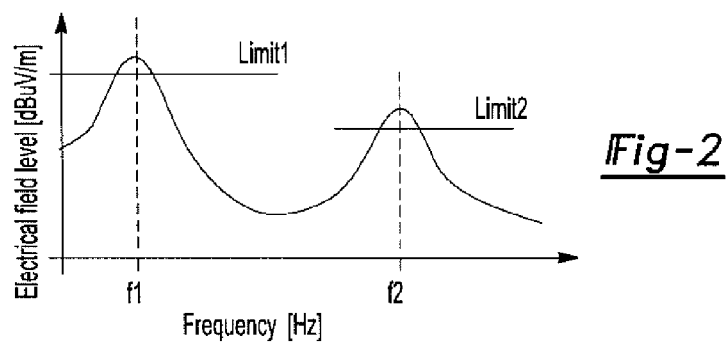
FIG. 2 illustrates a graph of EMI versus frequency on the vehicle EMC test.

With reference now to FIGS. 1 and 2, the antennas 16a-16f are all connected to a radio receiver 18 capable of receiving electromagnetic radiation over the antenna bandwidth or, at least, the frequency bandwidth of interest to the designer. Thereafter, during operation of the vehicle or system 10, the receiver 18 will receive electromagnetic radiation which varies in magnitude as a function of frequency.

Figure 5:
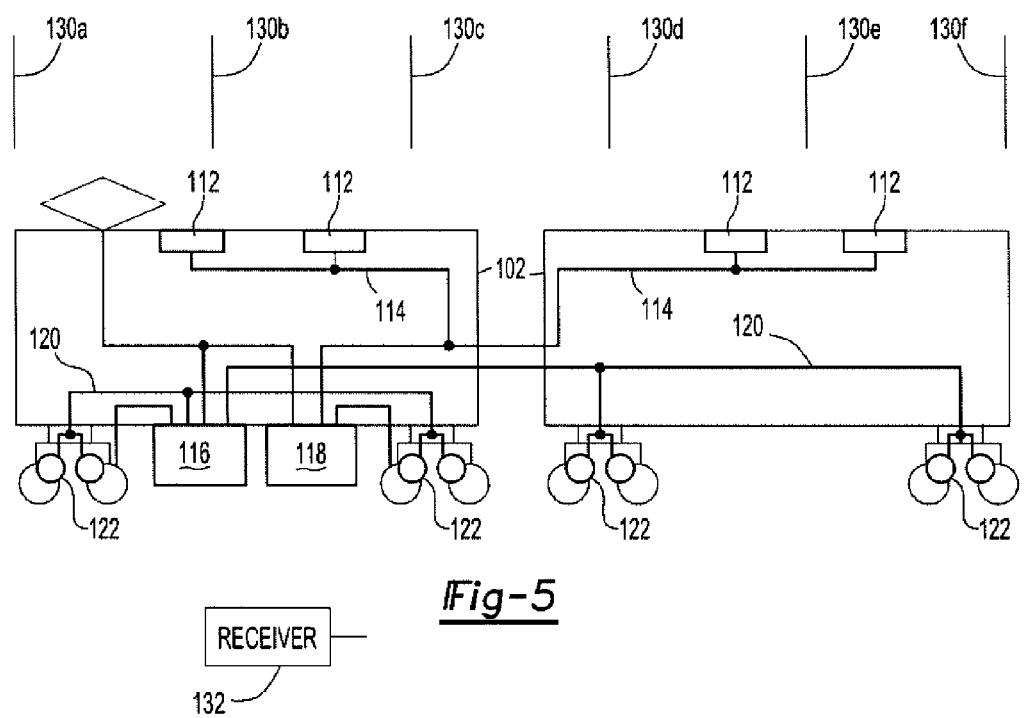
FIG. 5 is a view similar to FIG. 1, but illustrating the testing setup in a train vehicle.

With reference now to FIG. 5, an electrical system 100 for a train 102 is illustrated. The electrical system 100 includes a plurality of electrical components 112, such as lights and air conditioners, which are interconnected together by one or more wires or cables 114. Some common-mode currents undesirably and unintentionally occur on the wire cables 114 and 120 connecting the components 112 and motors 122 to a power source 116 and/or back up power unit 118. The power source 116 is also connected by cables 120 to the electric motors 122 which power the train 102. These common-mode currents may become the cause of the EMI noise.

A plurality of electromagnetic antennas 116a-116f are positioned around or in the automotive vehicle. These antennas 130a-130f are designed to receive electromagnetic radiation over a bandwidth of frequencies, e.g. 100 kHz to several GHz.

The antennas 130a-130f are all connected to a radio receiver 132 capable of receiving electromagnetic radiation over the antenna bandwidth or, at least, the frequency bandwidth of interest to the designer. Thereafter, during operation of the train 102 or system 10, the receiver 18 will receive electromagnetic radiation which varies in magnitude as a function of frequency. The method will now be described with respect to the automotive vehicle of FIG. 1, it being understood that a like description shall also apply to the train 102 of FIG. 5.

With reference to FIG. 2, an exemplary graph 19 of the received magnitude of EMI based on the vehicle EMC test on the vertical axis versus frequency on the horizontal axis is illustrated. As seen in FIG. 2, the EMI magnitude includes two peaks at frequencies $f_1$ and $f_2$. Furthermore, both peaks of EMI at frequencies $f_1$ and $f_2$ exceed limits which are required by a vehicle maker as the maximum acceptable EMI at any frequency within the frequency bandwidth.

In the case of FIG. 2, there are two error frequency bands which are $f_1$ and $f_2$. Then, with reference to FIG. 3, the magnitude of the received EMI for one of the frequencies, e.g. $f_1$, is then plotted as a function of the different antennas 16a-16f with the magnitude of the EMI on the vertical axis and the different antennas on the horizontal axis. This plot then produces a measurement profile 22 or graph of the actual measured EMI at the frequency $f_1$ versus the different antennas 16a-16f.

Figure 3:
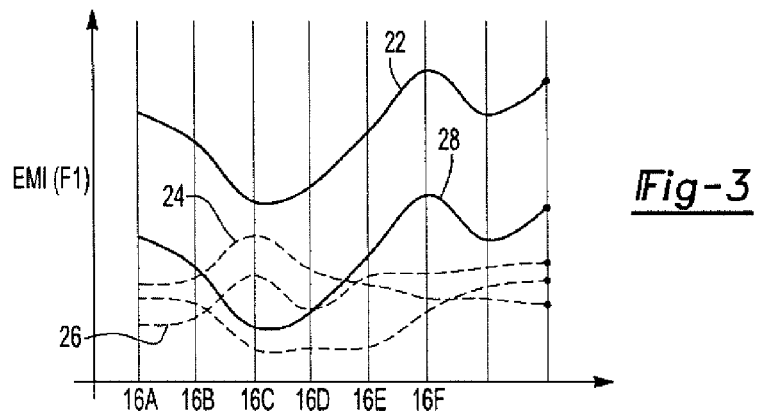
FIG. 3 is a graph illustrating a plot of measurement profile and simulation profile to identify the actual EMI source.

Still referring to FIG. 3, the EMI reception by the antennas 16a-16f at frequency $f_1$ is then simulated using appropriate CAD data to create a simulation profile of the received EMI versus the antennas for each potential EMI source. For example, a simulator calculates the electric field level for a first potential EMI source, e.g. two separated electrical components 12 (engine control unit and light bulb) with a cable interconnecting them, and the simulation result is acquired as a simulation profile 24 is shown in FIG. 3. A simulation profile for a second potential EMI source, e.g. the other two separated electrical components 12 (engine control unit and speaker system) with a cable interconnecting them, is shown by profile 26. A third profile 28 for a third potential EMI source, e.g. the other two separated electrical components 12 with a cable interconnecting them (converter and air conditioner) is similarly shown at simulation profile 28.

As is clear from FIG. 3, the actual shapes of the simulation profiles 24 and 26 are quite different than the shape of the measurement profile 22 representing the actual noise at frequency $f_1$. Conversely, the simulation profile 28 for the third potential EMI source matches the actual measurement profile 22. Since the shape of the simulation profile 28 matches the shape of the actual measurement profile 22, the potential EMI source, i.e. two separated electronic components coupled by a wire or cable (the cable connected between converter and air conditioner for this example of profile 28), is identified or determined to be the actual source of the unacceptably high EMI radiation at frequency $f_1$. Once this is determined, steps may be taken to correct the source of the unacceptable high EMI by proper grounding, shielding, or system redesign.

As used herein, the term "match" between the measurement profile 22 and simulation profile 28 does not require an exact match of these two profiles after scaling the simulation profile 28 so that it overlies the measurement profile 22. Rather, as used herein, the term "match" merely means that, after the simulation profile 28 is scaled relative to the measurement profile 22, the difference between the measured EMI for each antenna 16a-16f and the simulated EMI for each antenna after scaling is less than a predetermined amount, e.g. ±10%.

After the simulation profiles for each potential source of EMI are created and compared to the actual measurement profile 22 at frequency $f_1$, the entire procedure is then repeated for frequency $f_2$ as well as any other frequencies exhibiting a measured magnitude of EMI greater than the Limit2.

Figure 4:
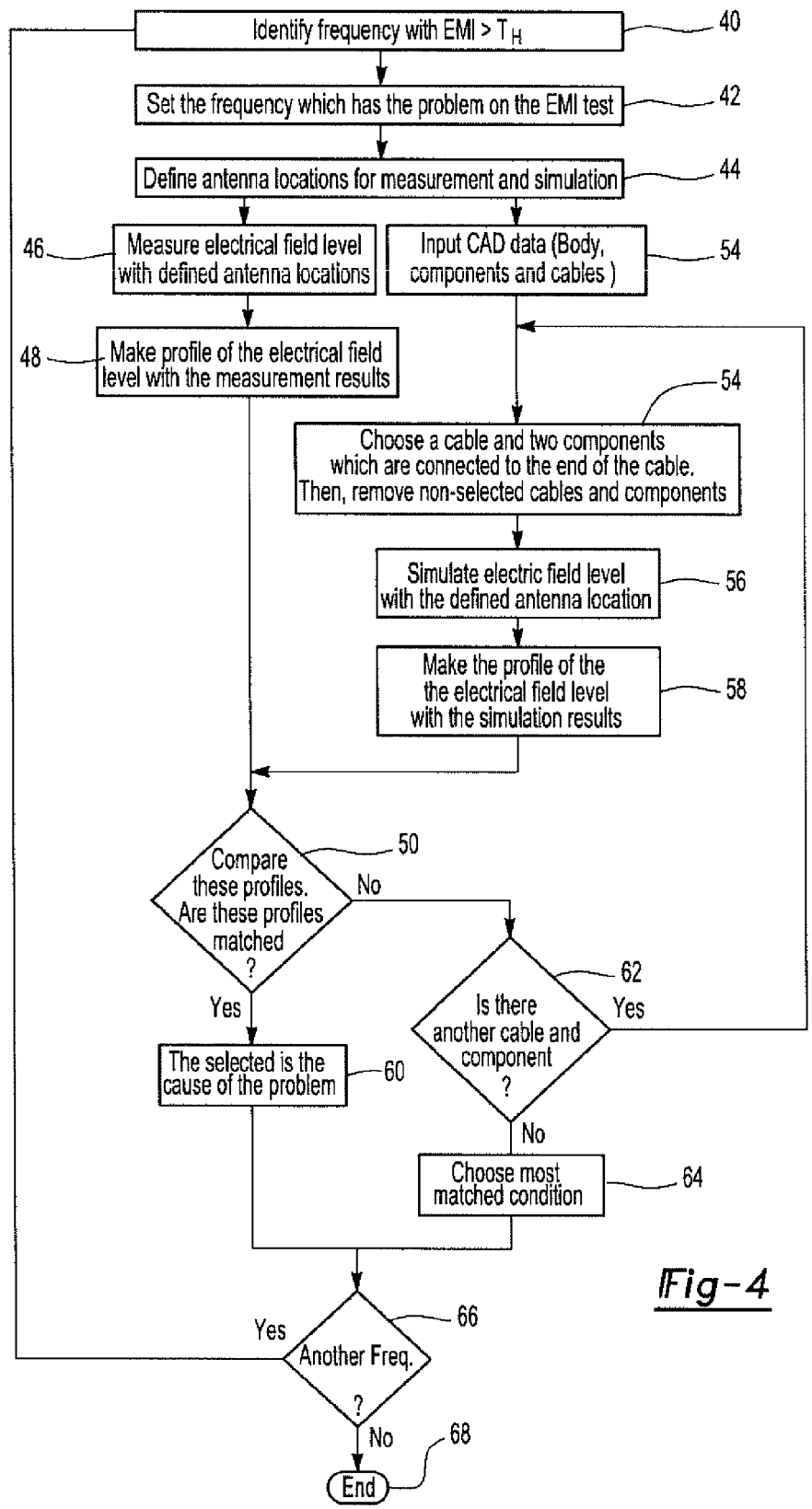
FIG. 4 is a flowchart illustrating the operation.

With reference now to FIG. 4, a flowchart illustrating the operation is shown. After the vehicle EMC test is performed using the testing antenna, step 40 identifies the frequency with EMI in excess of the limit. Step 40 then proceeds to step 42. At step 42 the first frequency, e.g. which exhibits excessive EMI is set. Step 42 then proceeds to step 44 where the antenna locations are determined for both the actual measurement of EMI as well as the simulated EMI. The antenna locations will be the same for both the measurement and the simulation of the EMI.

For the actual measurement of the EMI at the first frequency $f_1$, step 44 proceeds to step 46 where the electrical field or magnitude of the EMI is measured for each of the antenna locations. Step 46 then proceeds to step 48 to create the profile 22 with these measured amounts of EMI. Step 48 then proceeds to step 50.

Conversely, for the simulation of the EMI for each potential source of EMI, step 44 instead proceeds to step 52 where CAD data and modeling information are inputted into the computer. Step 52 then proceeds to step 54. At step 54 a first potential source of EMI, i.e. two electrical components coupled by a cable, is first identified and connected together. All other cables and components are then deactivated or removed for the simulation. Step 54 then proceeds to step 56.

At step 56, the simulation of the electric field magnitude or EMI is then conducted with the antenna locations set in step 44. Since only a single potential source of EMI, i.e. only two components coupled by a wire, are part of the simulation, the simulated EMI at the multiple antenna locations, if any, is attributable solely to that particular potential source of EMI. Step 56 then proceeds to step 58.

At step 58, a simulation profile, i.e. simulation profile 24, 26 or 28 (FIG. 3), is created for the particular potential source of EMI at the frequency $f_1$. Step 58 then proceeds to step 50 which determines if the simulation profile matches the profile obtained by the actual measurement of the EMI magnitude at the defined antenna locations. If so, the potential source of EMI is identified or determined to be the actual source of EMI. In that event, step 50 branches to step 60 and notifies the engineer or designer that the current potential source of EMI is the actual source of the EMI.

Conversely, if the simulation profile and the measurement profile do not match at step 50, step 50 instead proceeds to step 62 which determines if there is another potential source of EMI available for simulation. If so, step 62 branches back to step 54 and the above process is repeated. If not, step 62 instead branches to step 64 in which the simulation profile for a potential source of EMI that most closely matches the measurement profile for the source of EMI is identified as the actual source of EMI at the frequency $f_1$.

Both steps 60 and 64 proceed to step 66 which determines if there is another frequency which exhibits excessive EMI greater than a preset limit. For the example shown in FIG. 2, there is a second frequency, namely $f_2$, which does exhibit excessive EMI above limit Limit2. Consequently, step 66 branches back to step 42 where the above process is repeated for the frequency $f_2$. Conversely, if there is no other frequency that exhibits excessive EMI, step 66 instead exits to step 68 where the program ends.

From the foregoing, it can be seen that the present invention may provide a simple and yet highly effective method for identifying the actual sources of EMI in an electrical system, such as an automotive vehicle. The same procedure can be performed in a train vehicle as shown in FIG. 5. In a train system, a plurality of wiring harnesses extending through the train are employed to interconnect the various electrical components together. These electrical components are, for example, pantograph, light, air conditioner, motor, power unit, converter, and so on. Having described my invention, however, many modifications thereto will become apparent to those skilled in the art to which it pertains without deviation from the spirit of the invention as defined by the scope of the appended claims.

We claim:

1. A method for identifying EMI sources in an electrical system having a plurality of electrical components connected together by a plurality of cables, each set of two electrical components connected by one of said plurality of cables forming a potential EMI source, said method comprising the steps of:
   a) positioning a plurality of antennas at spaced positions around the vehicle,
   b) measuring EMI from each of said antennas over a plurality of frequencies,
   c) identifying one or more frequencies with measured EMI greater than a predetermined threshold,
   d) creating a measurement profile of received EMI versus said antennas for each of said identified frequencies,
   e) simulating EMI reception by said antennas at one of said identified frequencies for each potential EMI source and creating a simulation profile of received EMI versus said antennas for each potential EMI source,
   f) identifying an actual source of EMI from said potential EMI sources by comparing said measurement profile with said simulation profile for each potential EMI source wherein a match of the shape of said measurement profile with the shape of one simulation profile for one potential EMI source identifies said one potential EMI source as the actual source of EMI, repeating steps d) through f) for each identified frequency.

2. The method as defined in claim 1 wherein said electrical system comprises an automotive vehicle.

3. The method as defined in claim 1 wherein the simulation profile is created from CAD data.

4. The method as defined in claim 1 and comprising the step of identifying the closest match between the measurement profile and the simulation profile at each frequency if no match is identified.

5. The method as defined in claim 1 wherein said comparing step comprises the step of scaling the simulation profile to the measurement profile and determining the difference between the scaled simulation profile and the measurement profile for each antenna.

6. The method as defined in claim 1 wherein said electrical system comprises a train vehicle.

* * * * *